(12) United States Patent
Annunziata et al.

(10) Patent No.: US 11,094,878 B2
(45) Date of Patent: Aug. 17, 2021

(54) SHORT CIRCUIT REDUCTION IN MAGNETIC TUNNEL JUNCTIONS

(71) Applicant: INTERNATIONAL BUSINESS MACHINES CORPORATION, Armonk, NY (US)

(72) Inventors: Anthony J. Annunziata, Stamford, CT (US); Bruce B. Doris, Slingerlands, NY (US); Eugene J. O'Sullivan, Nyack, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 149 days.

(21) Appl. No.: 16/444,297

(22) Filed: Jun. 18, 2019

(65) Prior Publication Data

US 2020/0403151 A1    Dec. 24, 2020

(51) Int. Cl.
*H01L 43/12* (2006.01)
*H01L 43/02* (2006.01)
(Continued)

(52) U.S. Cl.
CPC ........... *H01L 43/12* (2013.01); *H01F 10/329* (2013.01); *H01F 10/3254* (2013.01); *H01F 41/34* (2013.01); *H01L 43/02* (2013.01)

(58) Field of Classification Search
CPC ......... H01L 43/12; H01L 43/02; H01L 43/08; H01L 27/222; H01F 10/329; H01F 10/3254

See application file for complete search history.

(56) References Cited

U.S. PATENT DOCUMENTS

| 8,334,213 B2 | 12/2012 | Mao |
| 9,978,934 B2 | 5/2018 | Paranjpe et al. |

(Continued)

FOREIGN PATENT DOCUMENTS

WO    2018026529 A1    2/2018

OTHER PUBLICATIONS

Wan et al., "Fabrication of magnetic tunnel junctions connected through a continuous free layer to enable spin logic devices", Online Retrieved URL:<https://arxiv.org/ftp/arxiv/papers/1711/1711.03609.pdf>, 2019, 16 pages.

*Primary Examiner* — Marcos D. Pizarro
*Assistant Examiner* — Antonio B Crite
(74) *Attorney, Agent, or Firm* — Cantor Colburn LLP; Daniel Morris

(57) ABSTRACT

A spin-transfer torque magneto-resistive random access memory (STT-MRAM) device is provided. The STT-MRAM device includes a substrate, a dielectric layer and a magnetic tunnel junction (MTJ) stack. The substrate includes a conductor and a landing pad. The MTJ stack includes a reference layer element, a free layer assembly and a barrier layer element. The reference layer element is lined with redeposited metal and is disposed on the landing pad within the dielectric layer. The free layer assembly includes a free layer element, a hard mask layer element disposed on the free layer element, redeposited metal lining sidewalls of the free and hard mask layer elements and dielectric material lining the redeposited metal. The barrier layer element is interposed between and has a same width as the reference layer element and the free layer assembly.

12 Claims, 6 Drawing Sheets

(51) Int. Cl.
*H01F 41/34* (2006.01)
*H01F 10/32* (2006.01)
*H01L 27/22* (2006.01)
*H01L 43/08* (2006.01)

(56) References Cited

U.S. PATENT DOCUMENTS

| | | |
|---|---|---|
| 10,134,981 B1 | 11/2018 | Yang et al. |
| 2014/0284736 A1* | 9/2014 | Toko .................. H01L 43/12 257/421 |
| 2018/0033957 A1 | 2/2018 | Zhang et al. |
| 2018/0248116 A1 | 8/2018 | Doczy et al. |

* cited by examiner

SHORT CIRCUIT REDUCTION IN MAGNETIC TUNNEL JUNCTIONS

BACKGROUND

The present invention generally relates to fabrication methods and resulting structures for semiconductor devices. More specifically, the present invention relates to a structure and method for reducing short circuits in magnetic tunnel junctions (MTJs) using planarized films.

Charge carriers (such as electrons) have a property known as spin which is a small quantity of angular momentum intrinsic to the carrier. While an electric current is generally unpolarized, a spin polarized current is one with more electrons of either spin. Spin-transfer torque is an effect in which an orientation of a magnetic layer in an MTJ can be modified using a spin-polarized current. More specifically, by passing a current through a thick magnetic layer of an MTJ (usually called a "fixed layer"), one can produce a spin-polarized current. If this spin-polarized current is directed into a second, thinner magnetic layer of the MTJ (the "free layer"), the angular momentum can be transferred to this layer to thereby change its orientation. This effect can be used to excite oscillations or even flip the orientation of a magnet.

In a particular case, spin-transfer torque can be used to flip active elements in magnetic random-access memory (MRAM), thereby forming spin-transfer torque magnetic random-access memory (STT-RAM or STT-MRAM), which is a non-volatile memory with near-zero leakage power consumption.

SUMMARY

Embodiments of the present invention are directed to a spin-transfer torque magneto-resistive random access memory (STT-MRAM) device. A non-limiting example of the STT-MRAM device includes a substrate, a dielectric layer and a magnetic tunnel junction (MTJ) stack. The substrate includes a conductor and a landing pad. The MTJ stack includes a reference layer element, a free layer assembly and a barrier layer element. The reference layer element is lined with redeposited metal and is disposed on the landing pad within the dielectric layer. The free layer assembly includes a free layer element, a hard mask layer element disposed on the free layer element, redeposited metal lining sidewalls of the free and hard mask layer elements and dielectric material lining the redeposited metal. The barrier layer element is interposed between and has a same width as the reference layer element and the free layer assembly.

Embodiments of the present invention are directed to a method of fabricating a spin-transfer torque magneto-resistive random access memory (STT-MRAM) device. A non-limiting example of the method includes etching an initial stack including reference, barrier, free and hard mask layers to an etch-stop layer at or below a lowermost surface of the free layer to form a secondary stack of remainders of the free and hard mask layers. The non-limiting example of the method further includes depositing dielectric material onto the etch-stop layer and redeposited metal lining the secondary stack and etching the dielectric material and the barrier and reference layers to form a tertiary stack of the secondary stack, the redeposited metal and remainders of the dielectric material and the barrier and reference layers. In addition, the non-limiting example of the method includes co-planarizing a dielectric layer with an uppermost surface of the remainder of the reference layer in the tertiary stack and angled-etching of redeposited metal lining the tertiary stack above the dielectric layer and the remainder of the dielectric material in the tertiary stack.

Embodiments of the present invention are directed to a method of fabricating a spin-transfer torque magneto-resistive random access memory (STT-MRAM) device. A non-limiting example of the method includes initial etching of a magnetic tunnel junction (MTJ) stack, stopping the initial etching at barrier layer material of the MTJ stack to partially pattern an MTJ, forming a dielectric spacer on a side wall of the MTJ, etching to a bottom contact to continue patterning of the MTJ with the dielectric spacer, forming a dielectric film around reference layer material of the MTJ and angled-etching to trim and clean redeposited metal from the barrier layer material.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
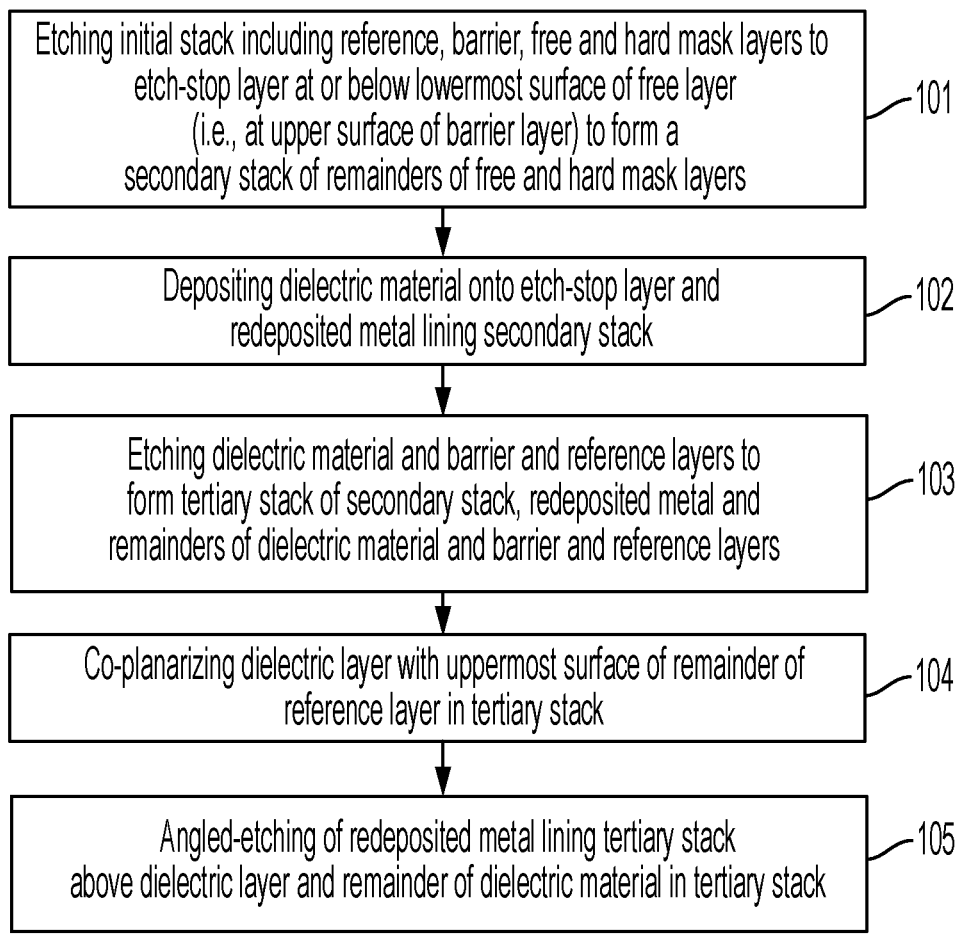
FIG. 1 is a flow diagram illustrating a method of fabricating an STT-MRAM device in accordance with embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, STT-MRAM devices offer many benefits over semiconductor based memories such as dynamic random-access memory (DRAM) and static random-access memory (SRAM). Still, in order to compete with DRAM and SRAM, STT-MRAM devices must be integrated into wiring layers of standard silicon logic and memory chips.

One of the most difficult aspects of this integration is the need to execute subtractive etching of a magnetic stack from a blanket film. This is necessary in order to define the STT-MRAM device in a particular case. Typically, specialized reactive ion etches (ME) and inert ion beam etches (IBE) are used for this process. However, known ME processes for etching MRAM cause significant device degradation in the small devices necessary for technological applications. At the same time, while IBE processes do not typically result in as much magnetic damage as RIE processes, IBE involves metal redeposition in even advanced IBE processes.

The metal redeposition associated with IBE processing can cause short circuits across tunnel barriers in STT-MRAM stacks and can be a serious yield detractor for STT-MRAM devices. Although the metal redeposition can often be removed by oxidizing the redeposited metal to render the redeposited metal into an insulating feature, the oxidation operation itself can cause device degradation.

Indeed, there are several elements and combinations of elements that are difficult to remove without re-deposition for any combination of IBE conditions. In these instances, short circuits are created in STT-MRAM devices. Such short circuits are often characterized as conductive materials that bridge from above an MTJ barrier to regions below the MTJ barrier.

Turning now to an overview of the aspects of the invention, one or more embodiments of the invention address the above-described shortcomings of the prior art by providing structures and methods configured to overcome the issues with patterning MTJ stacks that are extremely challenging to pattern without incurring short circuiting caused by redeposition of metal from a substrate due to IBE processing and without process degradation.

The above-described aspects of the invention address the shortcomings of the prior art by providing for initial IBE processing of an MTJ stack that stops after barrier material has been patterned to partially pattern the MTJ and subsequent formation of a dielectric spacer on a side wall of the MTJ. IBE processing is used to continue the MTJ patterning until a pillar is completely etched down to a bottom contact. A dielectric film is deposited, planarized and recessed to a desired level below a reference layer. An angled IBE process is used to trim and clean any redeposited metallic materials from the barrier.

Turning now to a more detailed description of aspects of the present invention, FIG. 1 is a flow diagram illustrating a method of fabricating an STT-MRAM device in accordance with embodiments of the present invention. As shown in FIG. 1, the method includes etching an initial stack including reference, barrier, free and hard mask layers to an etch-stop layer at or below a lowermost surface of the free layer (i.e., at an upper surface of the barrier layer) to form a secondary stack of remainders of the free and hard mask layers 101. The method further includes depositing dielectric material onto the etch-stop layer and redeposited metal lining the secondary stack 102 and etching the dielectric material and the barrier and reference layers to form a tertiary stack of the secondary stack, the redeposited metal and remainders of the dielectric material and the barrier and reference layers 103. In addition, the method includes co-planarizing a dielectric layer with an uppermost surface of the remainder of the reference layer in the tertiary stack 104 and angled-etching of redeposited metal lining the tertiary stack above the dielectric layer and the remainder of the dielectric material in the tertiary stack 105. The angled-etching of operation 105 can be executed such that an entirety of the tertiary stack has a uniform width from top-to-bottom.

The initial stack can further include a substrate including a conductive wire and a landing pad disposed on the conductive wire with the reference layer being disposed on the landing pad, the barrier layer being interposed between the reference and free layers and the hard mask layer being disposed on the free layer. In addition, it is to be understood that the substrate can include multiple conductive wires and multiple landing pads respectively disposed on corresponding conductive wires and that the reference layer is disposed on each of the multiple landing pads.

In accordance with additional or alternative embodiments, the etching of the initial stack of operation 101 can include a lithographic patterning of the initial stack, that the etching of the initial stack, the etching of the dielectric material and the barrier and reference layers and the angled-etching can include ion beam etching (IBE) and that the etching of the dielectric material can further include directional etching.

The method of fabricating the STT-MRAM device will now be described in further detail with reference to FIGS. 2-8.

Figure 2:
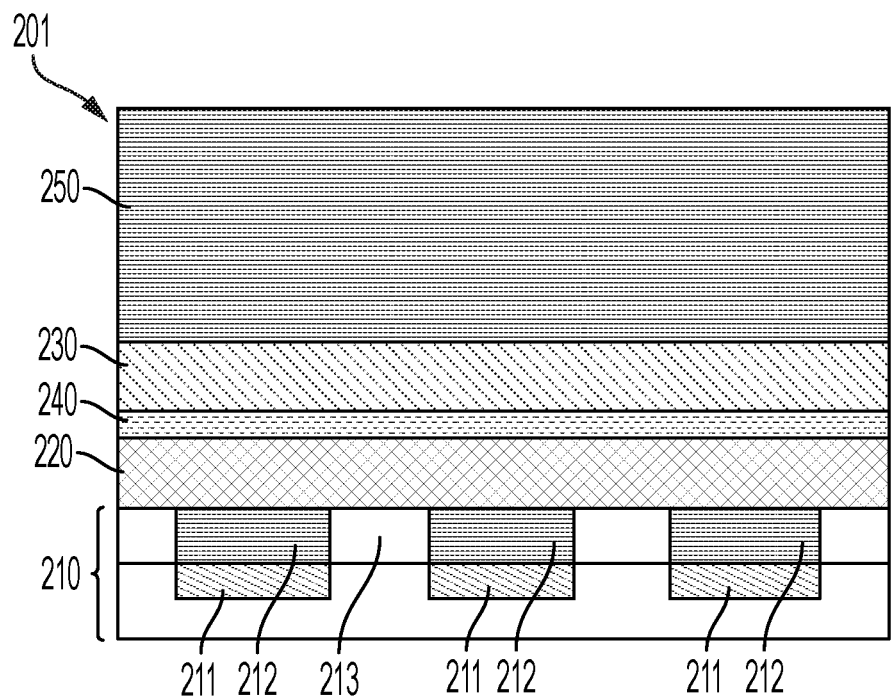
FIG. 2 is a side schematic view of an initial stack used in a method of fabricating an STT-MRAM device in accordance with embodiments of the present invention.

With reference to FIG. 2, an initial stack 201 for use in the method of fabricating the STT-MRAM device in accordance with embodiments of the present invention is provided. The initial stack 201 includes a substrate 210. The substrate 210 includes multiple conductors 211 that can be provided as conductive wires, multiple landing pads 212 that are respectively disposed on and in electrical communication with corresponding conductors 211 and dielectric material 213 surrounding the multiple conductors 211 and the multiple landing pads 212. An uppermost surface of the dielectric material 213 and respective uppermost surfaces of the multiple landing pads 212 can be coplanar. The initial stack 201 further includes a reference layer 220, which is disposed on and in electrical communication with each of the multiple landing pads 212, a free layer 230, a barrier layer 240 interposed between the reference layer 220 and the free layer 230 and a hard mask layer 250 that is disposed on the free layer 230.

Figure 3:
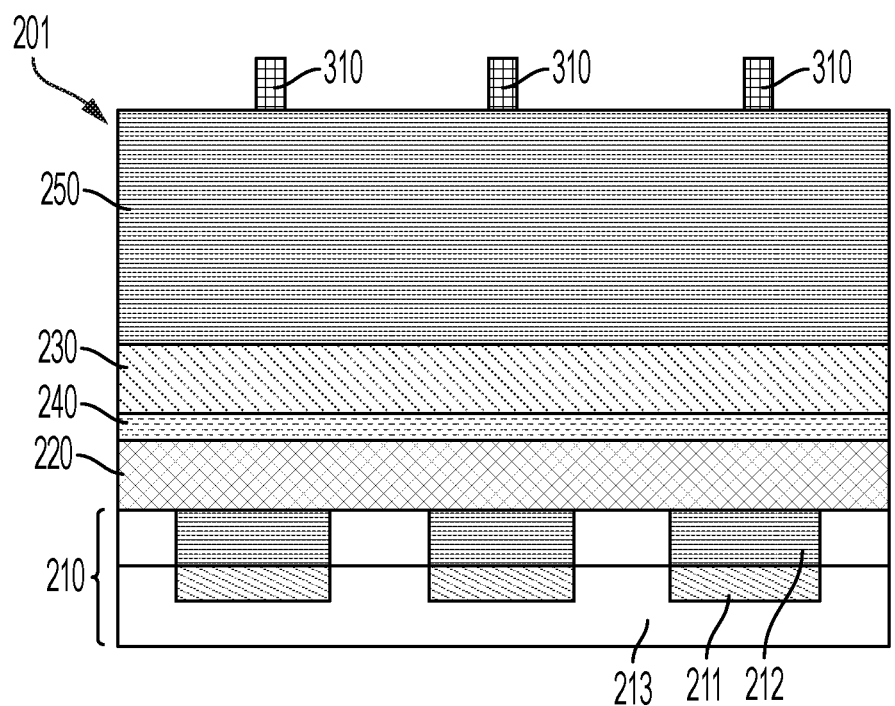
FIG. 3 is a side schematic view of lithographic patterning applied to an initial stack used in the method of fabricating an STT-MRAM device in accordance with embodiments of the present invention.

FIG. 3 is a side schematic view of lithographic patterning applied to the initial stack 201 of FIG. 2. The lithographic patterning can include the disposition of photoresist material 310 on the hard mask layer 250 at the various locations of the multiple landing pads 212. The photoresist material 310 will preserve portions of the initial stack 201 during subsequent processing.

Figure 4:
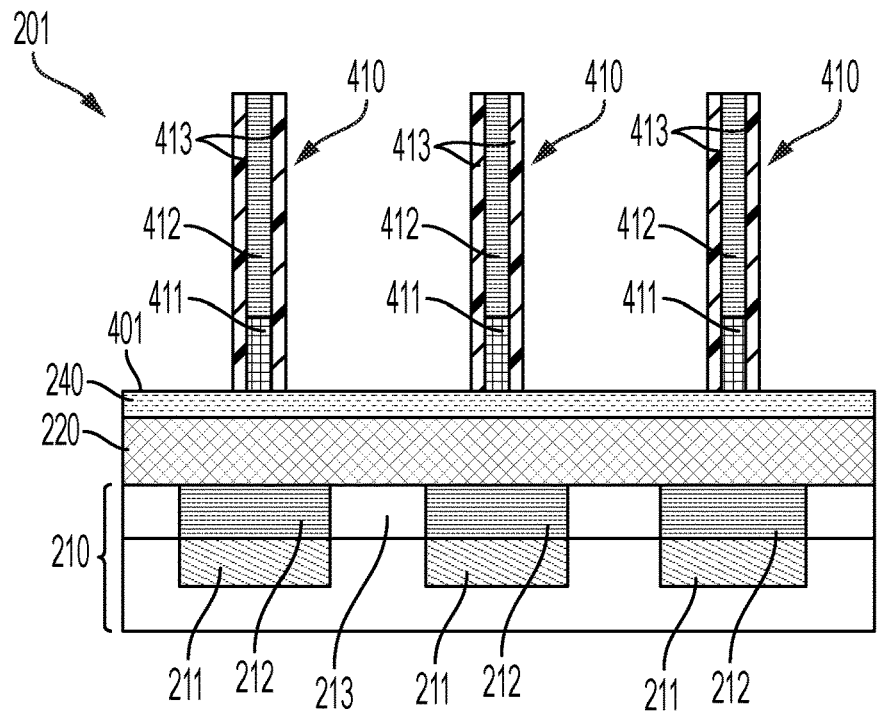
FIG. 4 is a side schematic view of an etched initial stack used in the method of fabricating an STT-MRAM device in accordance with embodiments of the present invention.

FIG. 4 is a side schematic view of the initial stack 201 of FIGS. 2 and 3 having been etched. The etching can include IBE processing and is stopped or ceased at least at an etch-stop layer 401. The etch-stop layer 401 can be located at a lowermost surface of the free layer 230 (see FIGS. 2 and 3) though the etching can continue in order to remove layers of the barrier layer 240 to an uppermost surface of the reference layer 220.

As shown in FIG. 4, the photoresist material 310 (see FIG. 3) has been removed and the etching results in the formation of secondary stacks 410. Each of the secondary stacks 410 is located at a corresponding one of the various locations of the multiple landing pads 212 and includes a free layer element 411, which is a remainder of the free layer 230 (see FIGS. 2 and 3), a hard mask layer element 412, which is a remainder of the hard mask layer 250 (see FIGS. 2 and 3) and redeposited metal material 413. The redeposited metal material 413 is a product of the etching process, especially in the case of the etching being conducted as an IBE process, and is disposed to line the sides of the free layer element 411 and the hard mask layer element 412.

Figure 5:
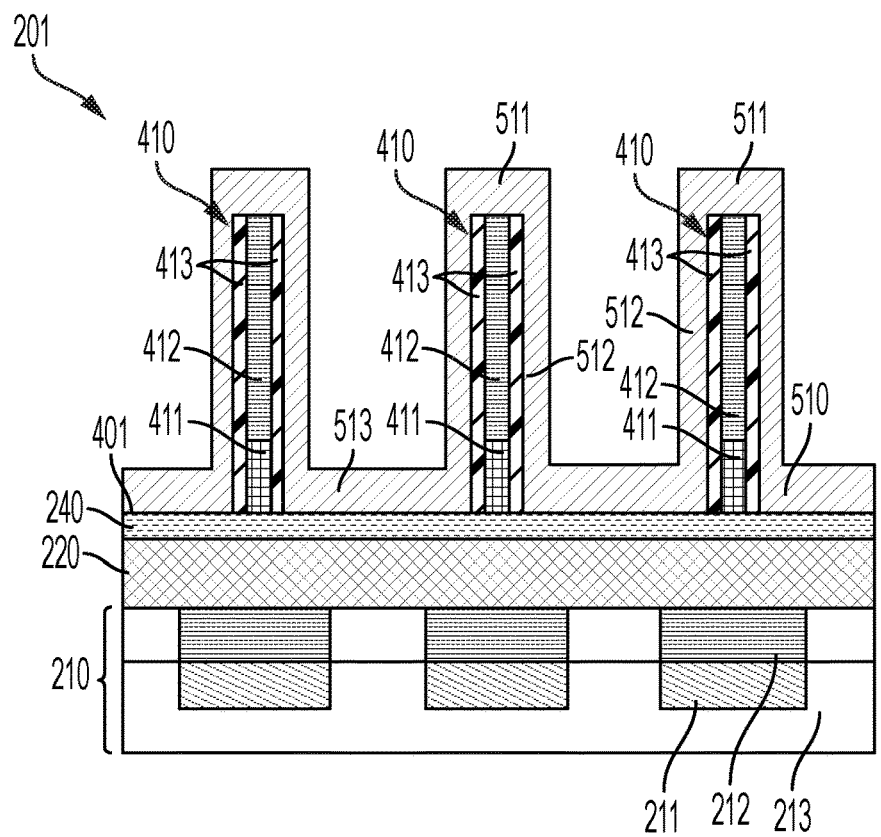
FIG. 5 is a side schematic view of dielectric spacer material deposited on an etched initial stack used in the method of fabricating an STT-MRAM device in accordance with embodiments of the present invention.

FIG. 5 is a side schematic view of dielectric spacer material 510 deposited on the etch-stop layer 401 of FIG. 4 and along sidewalls of the redeposited metal material 413. The dielectric spacer material 510 can include silicon nitride or another similar material and includes lower horizontal portions 511 that lie along the etch-stop layer 401, vertical portions 512 that lie along the redeposited metal materials 413 and upper horizontal portions 513 that lie over the hard mask layer elements 412.

Figure 6:
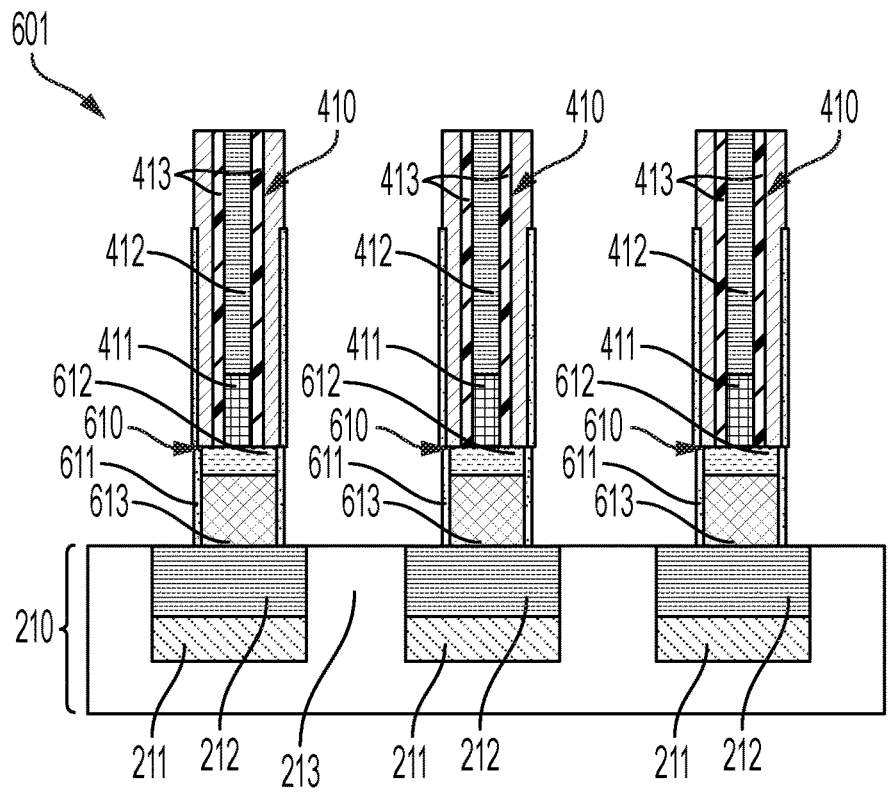
FIG. 6 is a side schematic view of an intermediate structure used in the method of fabricating an STT-MRAM device in accordance with embodiments of the present invention.

FIG. 6 is a side schematic view of an intermediate structure 601, which is formed as a result of further etching. In particular, a directional etching process is executed to remove the upper and lower horizontal portions 513 and 511 (see FIG. 5) and IBE processing can be used to remove the vertical portions 512 (see FIG. 5). The IBE processing can also be used to etch the barrier and reference layers 240 and 220 down to the uppermost surface of the dielectric material 213 and the respective uppermost surfaces of the multiple landing pads 212 of the substrate 210.

As shown in FIG. 6, as a result of the etching of the intermediate structure 601, a tertiary stack 610 is formed at a corresponding one of the various locations of the multiple landing pads 212 and has a lining of redeposited metal material 611. Each tertiary stack 610 includes the corresponding secondary stack 410 and the redeposited metal material 413 lining the corresponding secondary stack 410 (see FIG. 4) as well as remainders of the vertical portions 512 of the dielectric material spacer 510 (see FIG. 5) and a barrier layer element 612, which is a remainder of the barrier layer 240 (see FIGS. 2 and 3), and a reference layer element 613, which is a remainder of the reference layer 220 (see FIGS. 2 and 3).

That is, each tertiary stack 610 includes the reference layer element 613 disposed on and in electrical communication with the corresponding landing pad 212, the free layer element 411, the barrier layer element 612 interposed between the reference layer element 613 and the free layer element 411 and the hard mask layer element 412 disposed on the free layer element 411. Each tertiary stack 610 further includes the redeposited metal material 413 lining the free layer element 411 and the hard mask layer element 412, remainders of the vertical portions 512 of the dielectric material spacer 510 lining the redeposited metal material 413 and the redeposited metal material 611 lining the reference layer element 613 and the barrier layer element 612.

Figure 7:
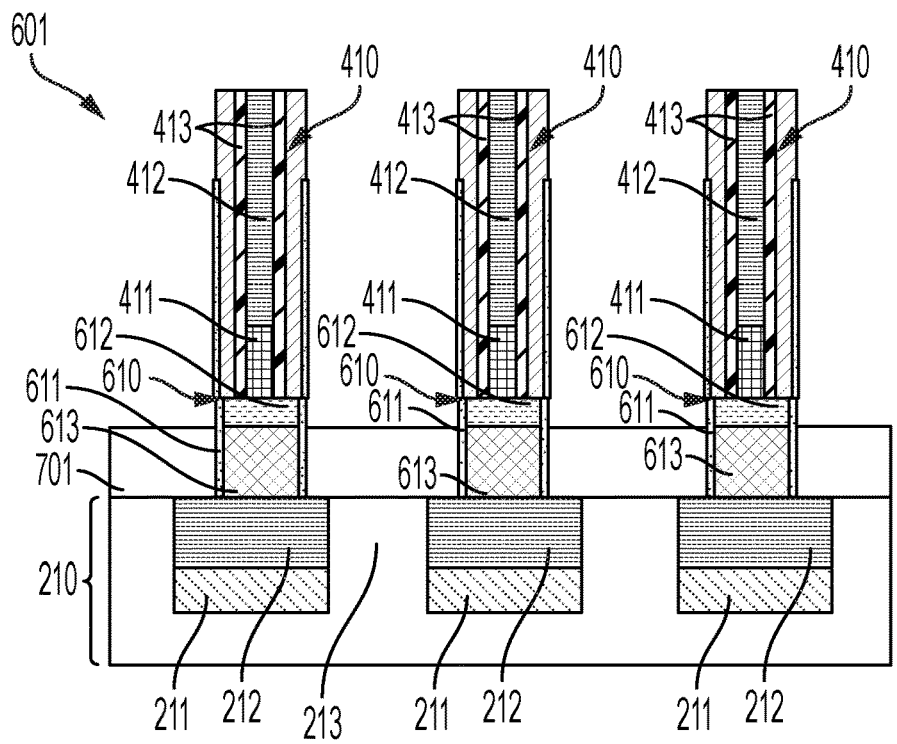
FIG. 7 is a side schematic view of a recessed dielectric film formed on an intermediate structure used in the method of fabricating an STT-MRAM device in accordance with embodiments of the present invention.

FIG. 7 is a side schematic view of a recessed dielectric film 701 that is formed on the intermediate structure 601 of FIG. 6. The dielectric film 701 can include one or more oxides and is formed by a depositional process and a subsequent planarization process that results in an uppermost surface of the dielectric film being coplanar with or recessed below respective uppermost surfaces of the reference layer elements 613 of each of the tertiary stacks 610.

Figure 8:
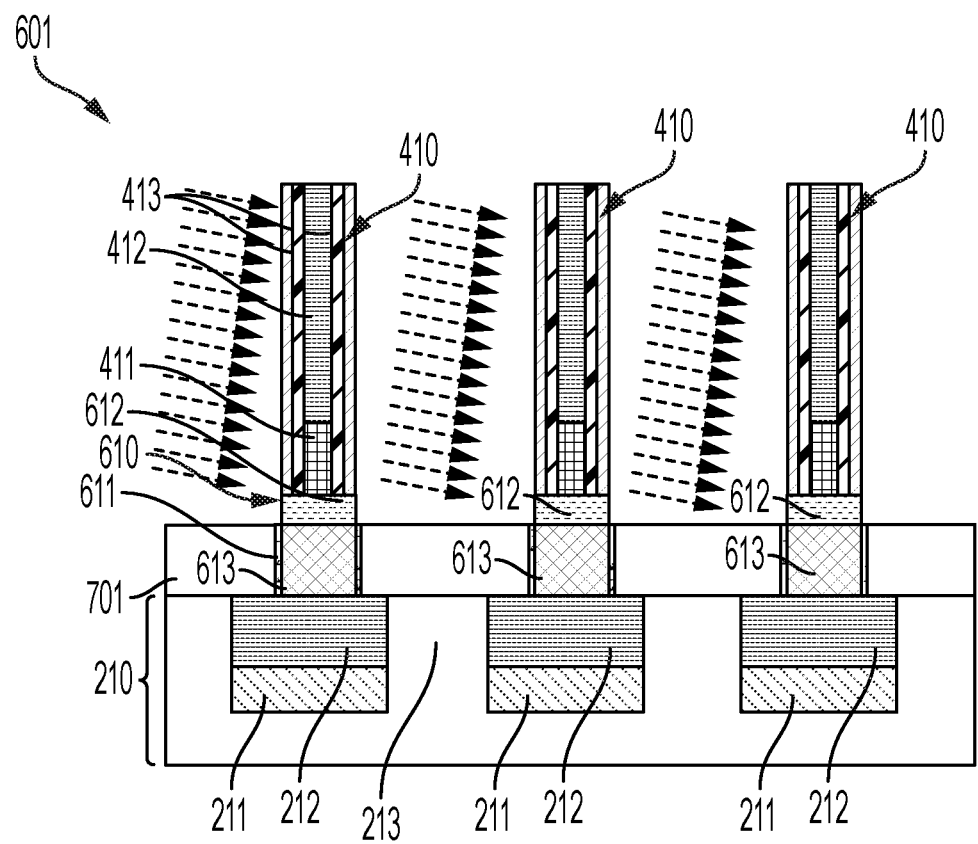
FIG. 8 is a side schematic view of an angled-etching of the intermediate structure of FIGS. 6 and 7 in accordance with embodiments of the present invention.

FIG. 8 is a side schematic view of an angled-etching process executed with respect to the tertiary stacks 610 of the intermediate structure 601 of FIGS. 6 and 7 and with respect to the redeposited metal material 611 exposed above the uppermost surface of the dielectric film 701. The angled-etching process results in the removal of the redeposited metal material 611 and the thinning of the remainders of the vertical portions 512 of the dielectric material spacer 510 whereby the tertiary stacks 610 eventually have a uniform width from top-to-bottom. That is, the barrier layer element 612 eventually has a same width as the reference layer element 613 and a same width as a combined width of the corresponding secondary stack 410, the redeposited metal material 413 lining the corresponding secondary stack 410 and the remainder of the vertical portions 512 of the dielectric material spacer 510.

Figure 9:
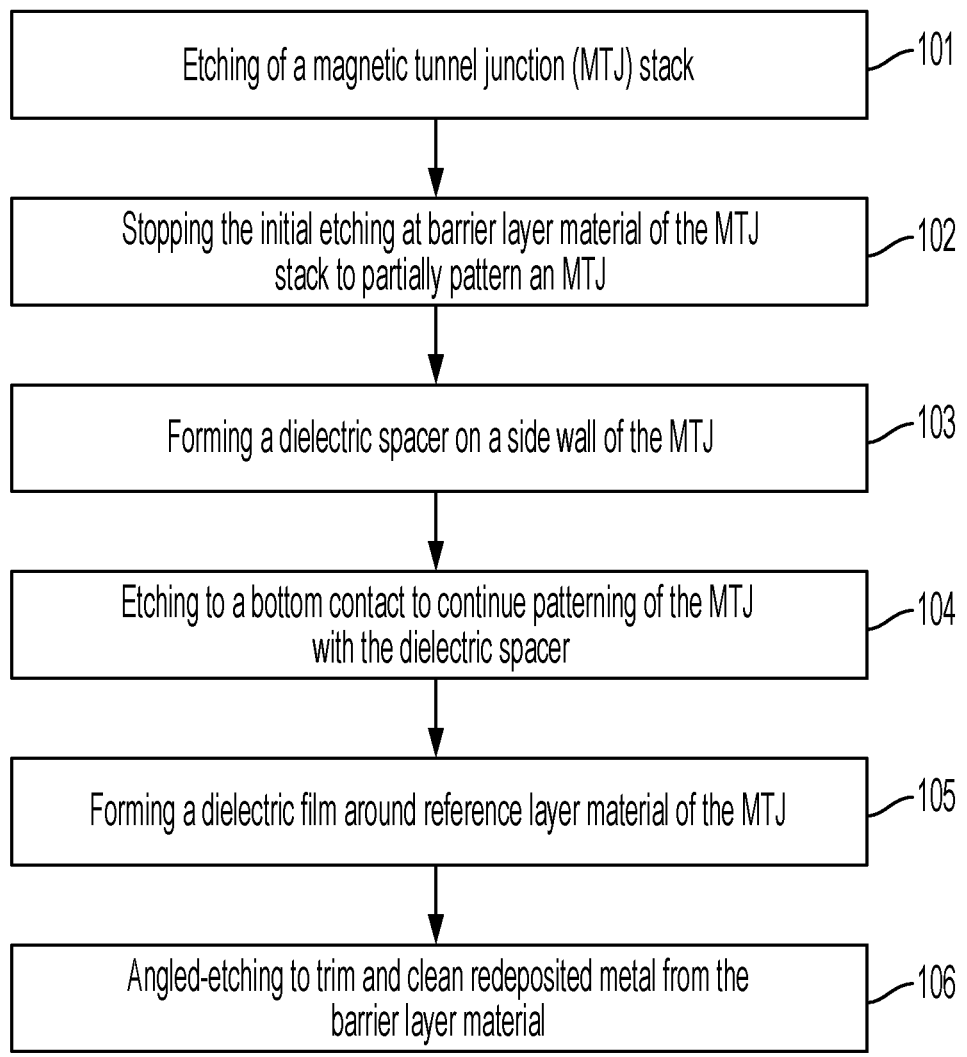
FIG. 9 is a flow diagram illustrating a method of fabricating an STT-MRAM device in accordance with embodiments of the present invention.

With reference to FIG. 9, a method of fabricating an STT-MRAM device as described above is provided in accordance with embodiments of the present invention. As shown in FIG. 9, the method includes etching of a magnetic tunnel junction (MTJ) stack 901, stopping the initial etching at barrier layer material of the MTJ stack to partially pattern an MTJ 902, forming a dielectric spacer on a side wall of the MTJ 903, etching to a bottom contact to continue patterning of the MTJ with the dielectric spacer 904, forming a dielectric film around reference layer material of the MTJ 905 and angled-etching to trim and clean redeposited metal from the barrier layer material 906.

In accordance with further embodiments of the present invention, the method of FIG. 9 can be characterized in that the initial etching, the etching to the bottom contact and the angled-etching can include IBE processing, that the etching to the bottom contact can further include directional etching and that the reference layer material and the barrier layer material can have a same uniform width.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a spin-transfer torque magneto-resistive random access memory (STT-MRAM) device, the method comprising:
    etching an initial stack comprising reference, barrier, free and hard mask layers to an etch-stop layer at or below a lowermost surface of the free layer to form a secondary stack of remainders of the free and hard mask layers;
    depositing dielectric material onto the etch-stop layer and redeposited metal lining the secondary stack;
    etching the dielectric material and the barrier and reference layers to form a tertiary stack of the secondary stack, the redeposited metal and remainders of the dielectric material and the barrier and reference layers;
    co-planarizing a dielectric layer with an uppermost surface of the remainder of the reference layer in the tertiary stack; and
    angled-etching of redeposited metal lining the tertiary stack above the dielectric layer and the remainder of the dielectric material in the tertiary stack.

2. The method according to claim 1, wherein the etching of the initial stack comprises lithographic patterning.

3. The method according to claim 1, wherein the etch-stop layer is an upper surface of the barrier layer.

4. The method according to claim 1, wherein the angled-etching is executed such that the tertiary stack has a uniform width.

5. The method according to claim 1, wherein:
    the initial stack further comprises a substrate comprising a conductive wire and a landing pad disposed on the conductive wire; and
    the reference layer is disposed on the landing pad, the barrier layer is interposed between the reference and free layers and the hard mask layer is disposed on the free layer.

6. The method according to claim 5, wherein the substrate comprises multiple conductive wires and multiple landing pads respectively disposed on corresponding conductive wires and the reference layer is disposed on each of the multiple landing pads.

7. The method according to claim 1, wherein the etching of the initial stack, the etching of the dielectric material and the barrier and reference layers and the angled-etching comprise ion beam etching (IBE).

8. The method according to claim 7, wherein the etching of the dielectric material further comprises directional etching.

9. A method of fabricating a spin-transfer torque magneto-resistive random access memory (STT-MRAM) device, the method comprising:
    initial etching of a magnetic tunnel junction (MTJ) stack;
    stopping the initial etching at barrier layer material of the MTJ stack to partially pattern an MTJ;
    forming a dielectric spacer on a side wall of the MTJ;
    etching to a bottom contact to continue patterning of the MTJ with the dielectric spacer;
    forming a dielectric film around reference layer material of the MTJ; and
    angled-etching to trim and clean redeposited metal from the barrier layer material.

10. The method according to claim 9, wherein the reference layer material and the barrier layer material have a same uniform width.

11. The method according to claim 9, wherein the initial etching, the etching to the bottom contact and the angled-etching comprise ion beam etching (IBE).

12. The method according to claim 11, wherein the etching to the bottom contact further comprises directional etching.

\* \* \* \* \*